United States Patent
Natori et al.

(10) Patent No.: US 6,617,627 B2
(45) Date of Patent: Sep. 9, 2003

(54) MEMORY CELL ARRAY HAVING FERROELECTRIC CAPACITORS, METHOD OF FABRICATING THE SAME, AND FERROELECTRIC MEMORY DEVICE.

(75) Inventors: Eiji Natori, Chino (JP); Kazumasa Hasegawa, Fujimi-cho (JP); Koichi Oguchi, Suwa (JP); Takao Nishikawa, Shiojiri (JP); Tatsuya Shimoda, Fujimi-cho (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/931,915

(22) Filed: Aug. 20, 2001

(65) Prior Publication Data

US 2002/0031005 A1 Mar. 14, 2002

(30) Foreign Application Priority Data

Aug. 22, 2000 (JP) ........................................ 2000-251436

(51) Int. Cl.[7] .............................................. H01L 31/062
(52) U.S. Cl. ..................................................... 257/295
(58) Field of Search ............................. 365/145; 257/295

(56) References Cited

U.S. PATENT DOCUMENTS

| | | | | |
|---|---|---|---|---|
| 5,060,191 A | | 10/1991 | Nagasaki et al. | 365/145 |
| 5,530,667 A | * | 6/1996 | Omura et al. | 257/295 |
| 5,963,466 A | * | 10/1999 | Evans, Jr. | 257/295 |
| 6,077,716 A | * | 6/2000 | Yoo | 438/240 |
| 6,104,324 A | | 8/2000 | Kim | 341/58 |
| 6,201,726 B1 | * | 3/2001 | Evans | 365/145 |

FOREIGN PATENT DOCUMENTS

| | | |
|---|---|---|
| JP | 2-154388 A | 6/1990 |
| JP | 8-255879 A | 10/1996 |
| JP | 9-91970 A | 4/1997 |
| JP | 9-102587 A | 4/1997 |
| JP | 10-303378 A | 11/1998 |
| WO | WO 99/12170 A2 | 3/1999 |

OTHER PUBLICATIONS

U.S. patent application Ser. No. 09/762,222, Shioma et al., filed Feb. 6, 2001.

* cited by examiner

*Primary Examiner*—David Nelms
*Assistant Examiner*—Tu-Tu Ho
(74) *Attorney, Agent, or Firm*—Oliff & Berridge, PLC

(57) ABSTRACT

The present invention relates to: a memory cell array which is capable of decreasing the parasitic capacitance or load capacitance of signal electrodes and has ferroelectric layers making up ferroelectric capacitors and having a predetermined pattern; a method of fabricating the memory cell array, and a ferroelectric memory device. In the memory cell array, memory cells formed of ferroelectric capacitors are arranged in a matrix. The ferroelectric capacitors include first signal electrodes, second signal electrodes arranged in a direction intersecting the first signal electrodes, and ferroelectric layers disposed linearly along either the first signal electrodes or the second signal electrodes. Alternatively, the ferroelectric layers may be disposed only in intersection areas of the first and second signal electrodes.

15 Claims, 13 Drawing Sheets

A - A

F1-F1

F2-F2

MEMORY CELL ARRAY HAVING FERROELECTRIC CAPACITORS, METHOD OF FABRICATING THE SAME, AND FERROELECTRIC MEMORY DEVICE.

Japanese Patent Application No. 2000-251436, filed on Aug. 22, 2000, is hereby incorporated by reference in its entirety.

TECHNICAL FIELD

The present invention relates to a memory cell array having ferroelectric capacitors. More particularly, the present invention relates to a simple matrix memory cell array using only ferroelectric capacitors instead of cell transistors, a method of fabricating the same, and a ferroelectric memory device including the memory cell array.

BACKGROUND

A simple matrix memory cell array using only ferroelectric capacitors instead of cell transistors has a very simple structure and enables a higher degree of integration. Therefore, development of such a memory cell array has been expected.

SUMMARY OF THE INVENTION

An objective of the present invention is to provide: a memory cell array which is capable of decreasing the parasitic capacitance or load capacitance of signal electrodes and has ferroelectric layers making up ferroelectric capacitors and having a predetermined pattern; a method of fabricating the same; and a ferroelectric memory device including the memory cell array of the present invention.

According to a first aspect of the present invention, there is provided a first memory cell array having ferroelectric capacitors, wherein:
  memory cells formed of ferroelectric capacitors are arranged in a matrix;
  each of the ferroelectric capacitors includes a first signal electrode, a second signal electrode disposed in a direction intersecting the first signal electrode, and a ferroelectric layer disposed at least in an intersection area of the first and second signal electrodes; and
  the ferroelectric layer is disposed linearly along one of the first signal electrode and the second signal electrode.

Specifically, the memory cell array may have: (1) a structure in which the ferroelectric layer is selectively disposed over the first signal electrode; or (2) a structure in which the ferroelectric layer is selectively disposed under the second signal electrode.

In this memory cell array, since the ferroelectric layer is formed linearly along one of the first and second signal electrode, the parasitic capacitance or load capacitance of the other of the first and second signal electrodes can be decreased.

According to a second aspect of the present invention, there is provided a second memory cell array having ferroelectric capacitors, wherein: memory cells formed of ferroelectric capacitors are arranged in a matrix; each of the ferroelectric capacitors includes a first signal electrode, a second signal electrode disposed in a direction intersecting the first signal electrode, and a ferroelectric layer disposed at least in an intersection area of the first and second signal electrodes; and the ferroelectric layer is disposed only in the intersection area of the first and second signal electrodes. In this memory cell array, since the ferroelectric layers making up the ferroelectric capacitors are formed in the smallest region, the parasitic capacitance or load capacitance of the signal electrodes can be further decreased.

In this memory cell array, since the ferroelectric layer forming the ferroelectric capacitor has a minimum area, the parasitic capacitance or load capacitance of the signal electrodes can be further reduced.

The above memory cell arrays have the following features.

(A) The ferroelectric capacitors may be disposed on a base; and a dielectric layer may be provided between laminates each of which includes the first signal electrode and the ferroelectric layer so as to cover an exposed surface of the base. In this case, the dielectric layer may be formed of a material having a dielectric constant lower than a dielectric constant of the ferroelectric layer. The parasitic capacitance or load capacitance of the signal electrodes can be reduced effectively by providing such dielectric layer.

(B) An undercoat layer having surface properties differing from surface properties of the base may be formed on the base. By providing such undercoat layer, at least either the signal electrode or the ferroelectric layer can be formed selectively without etching. The undercoat layer may be provided in an area in which the ferroelectric capacitors are not formed; and a surface of the undercoat layer may have a low affinity for a material forming the ferroelectric capacitors, in comparison with a surface of the base. Alternatively, the undercoat layer may be provided in an area in which the ferroelectric capacitors are formed; and a surface of the undercoat layer may have a high affinity for a material forming the ferroelectric capacitors, in comparison with a surface of the base.

According to a third aspect of the present invention, there is provided a method of fabricating a memory cell array in which memory cells formed of ferroelectric capacitors are arranged in a matrix, comprising the steps of:
  forming a first signal electrode with a predetermined pattern on a base;
  selectively forming a ferroelectric layer on the first signal electrode linearly along the first signal electrode; and
  forming a second signal electrode in a direction intersecting the first signal electrode.

This fabrication method may further comprise the steps of: forming on the base a first region having surface properties which give priority in deposition to a material of at least one of the first signal electrode and the ferroelectric layer, and a second region having surface properties which give difficulty in deposition to the material of at least one of the first signal electrode and the ferroelectric layer in comparison with the first region; and providing the material of at least one of the first signal electrode and the ferroelectric layer and selectively forming one of the first signal electrode and the ferroelectric layer in the first region. The first and second regions may be defined on a surface of the base.

In this fabrication method, the surface of the base may be exposed in the first region; and in the second region may be formed an undercoat layer having surface properties having a low affinity for materials of the first signal electrode and the ferroelectric layer in comparison with the exposed surface of the base in the first region. Alternatively, in this fabrication method, the surface of the base may be exposed in the second region; and in the first region may be formed an undercoat layer having surface properties having a high affinity for materials of the first signal electrode and the ferroelectric layer in comparison with the exposed surface of the base in the second region.

According to a fourth aspect of the present invention, there is provided a method of fabricating a memory cell array in which memory cells formed of ferroelectric capacitors are arranged in a matrix, comprising the steps of:

forming a first signal electrode with a predetermined pattern on a base; and forming a ferroelectric layer and a second signal electrode in a direction intersecting the first signal electrode, wherein the ferroelectric layer is disposed linearly along the second signal electrode.

In this fabrication method, the ferroelectric layer and the second signal electrode may be patterned by etching using the same mask.

According to a fifth aspect of the present invention, there is provided a method of fabricating a memory cell array in which memory cells formed of ferroelectric capacitors are arranged in a matrix, comprising the steps of:

forming a first signal electrode with a predetermined pattern on a base;

forming a ferroelectric layer on the first signal electrode linearly along the first signal electrode;

forming a second signal electrode in a direction intersecting the first signal electrode; and patterning the ferroelectric layer to be disposed only in an intersection area of the first and second signal electrodes.

In this fabrication method, at least either the signal electrode or ferroelectric layers may be provided by using the above-described undercoat layer. The ferroelectric layers and the signal electrode may be patterned by etching using the same mask.

In each of the above fabrication methods, the dielectric layer may be provided between laminates which include the signal electrode and the ferroelectric layer so as to cover at least an exposed surface of the base.

According to a sixth aspect of the present invention, there is provided a ferroelectric memory device comprising the memory cell array according to the present invention.

DETAILED DESCRIPTION OF THE EMBODIMENTS

First Embodiment (Device)

Figure 1:
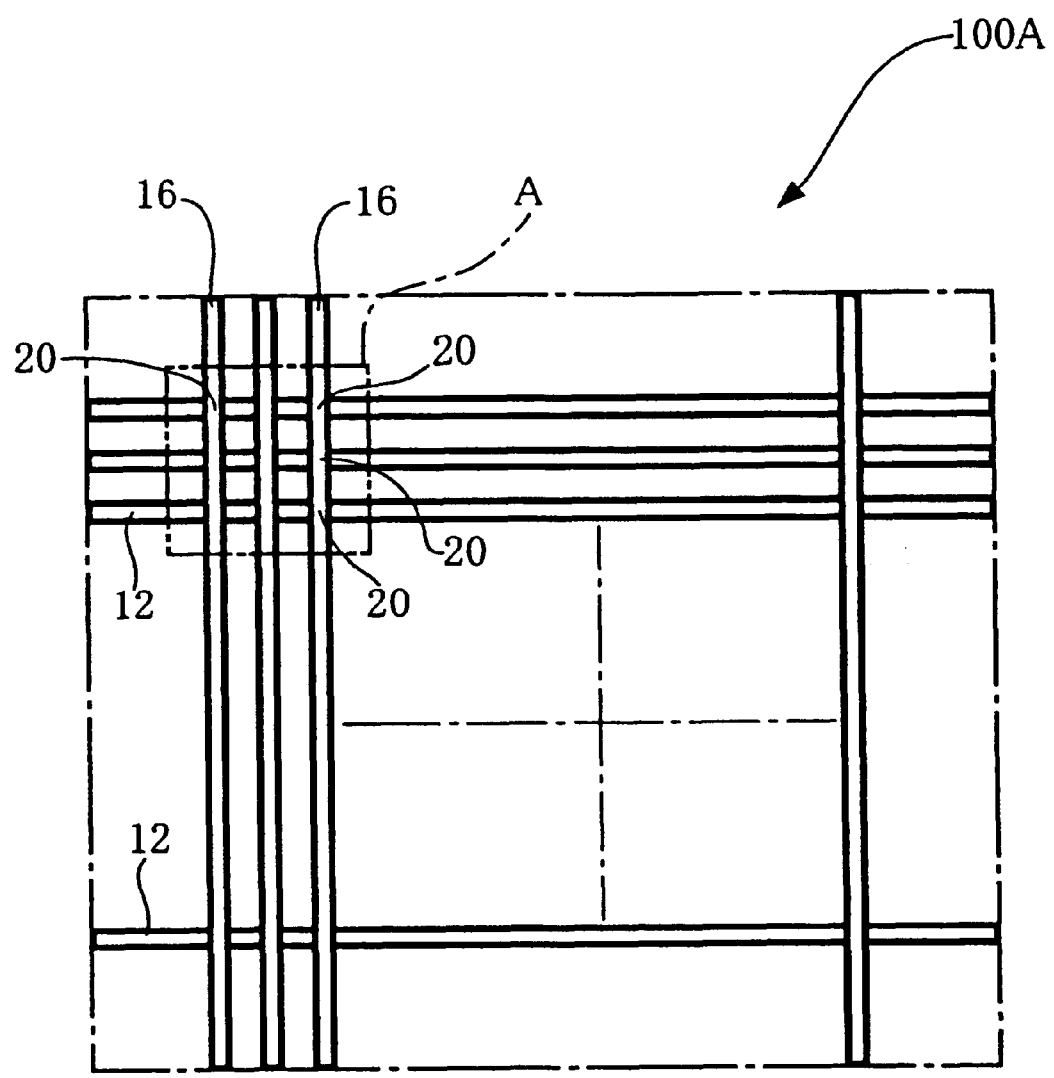
FIG. 1 is a plan view schematically showing a memory cell array according to a first embodiment of the present invention.
Figure 2:
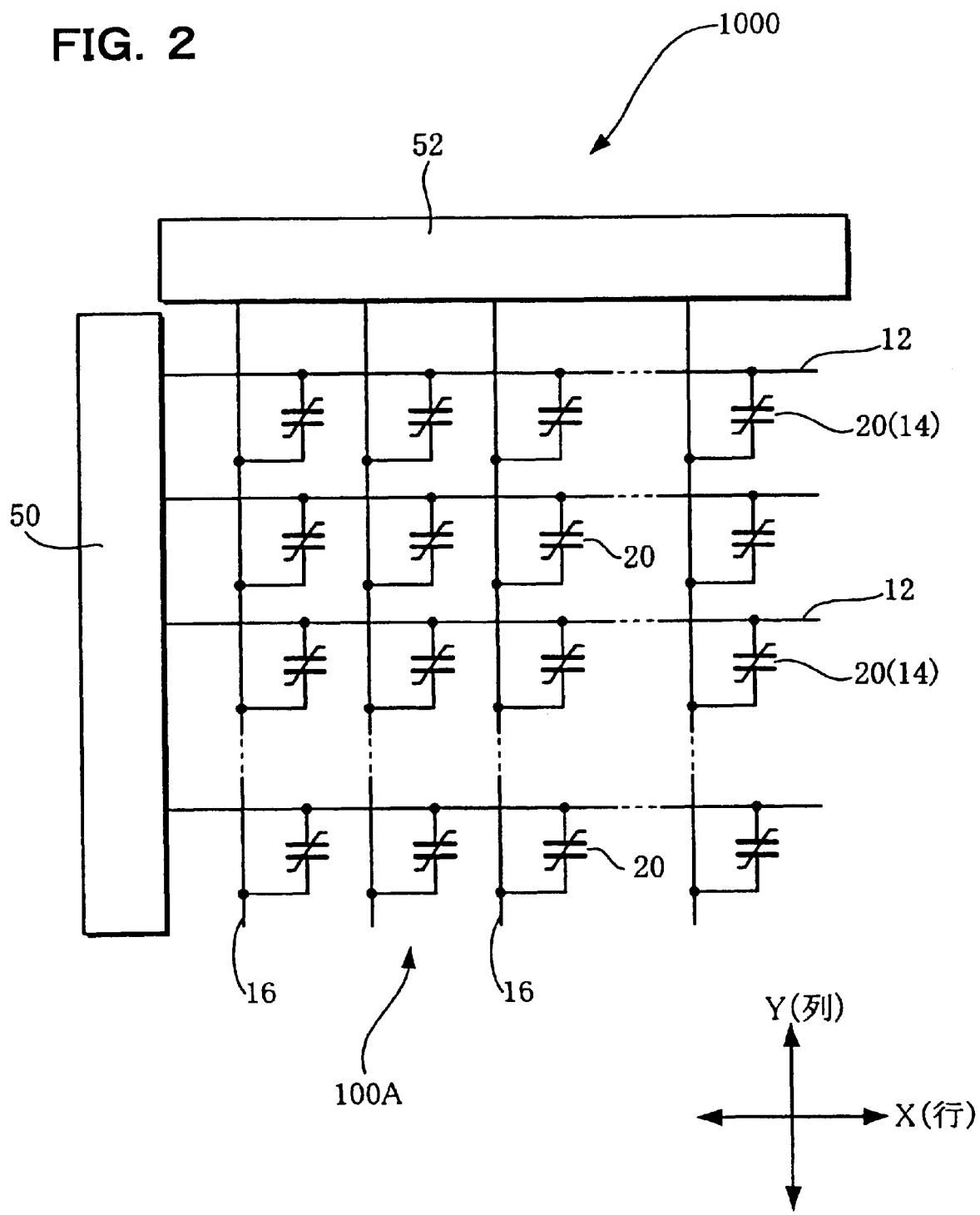
FIG. 2 is a view showing a ferroelectric memory device according to the first embodiment of the present invention.
Figure 3:
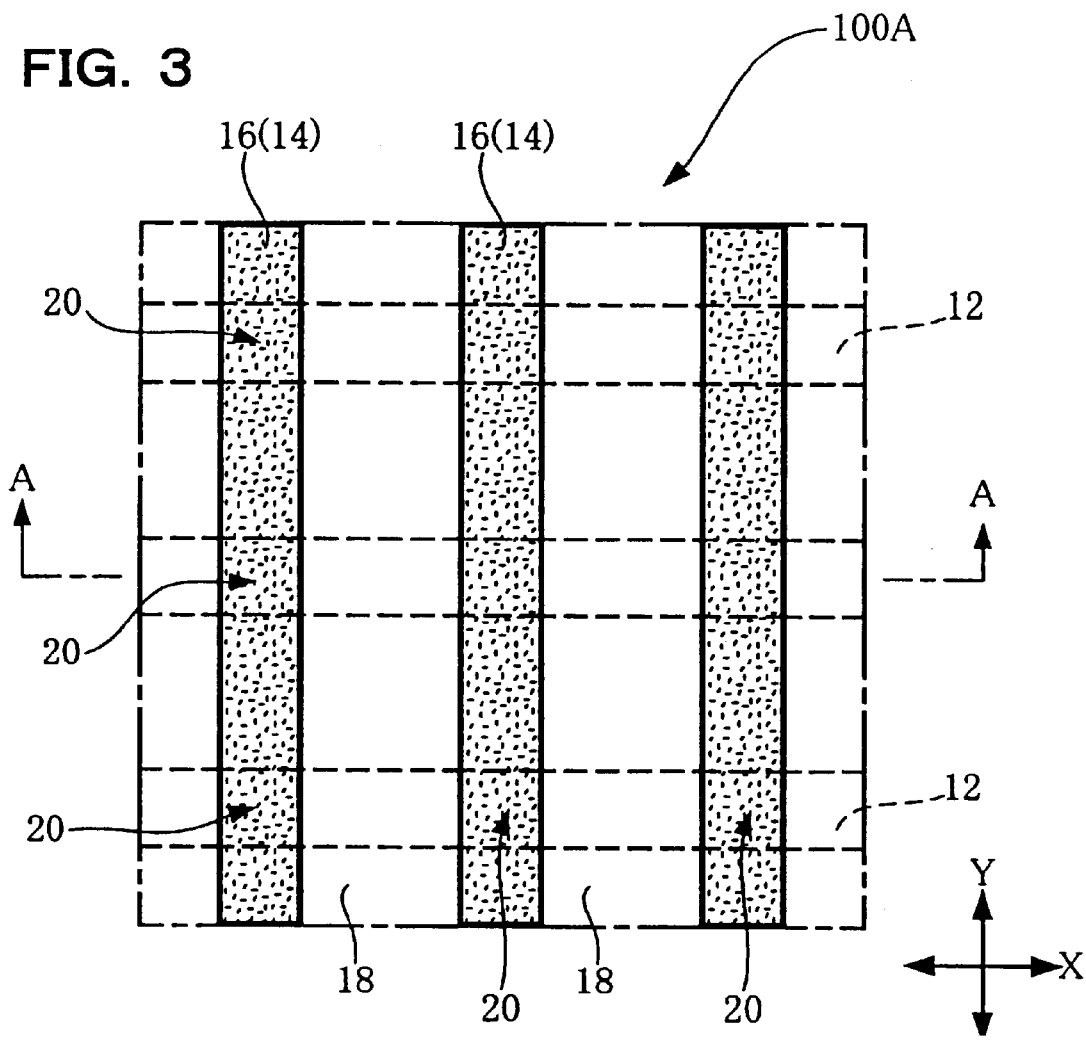
FIG. 3 is an enlarged plan view showing a portion of the memory cell array shown in FIG. 1.
Figure 4:
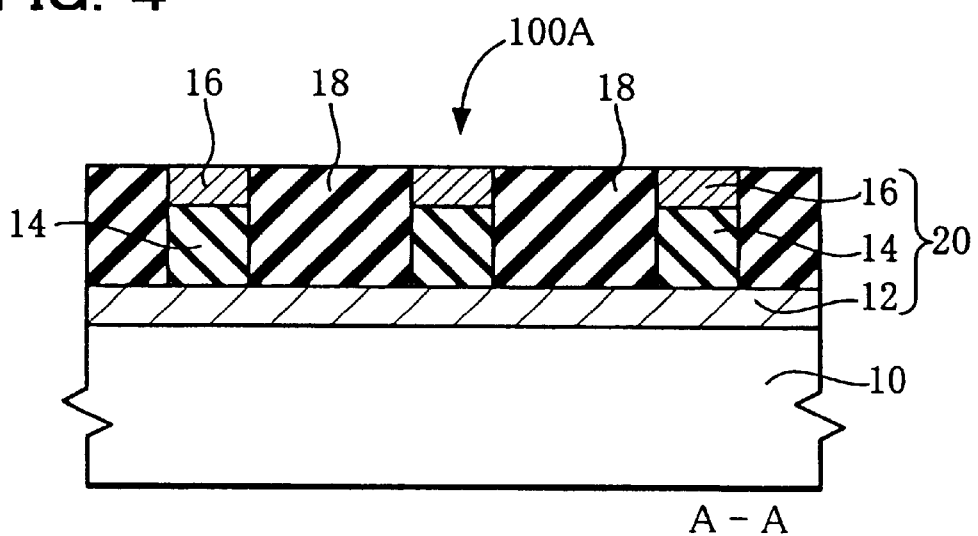
FIG. 4 is a cross-sectional view along the line A—A shown in FIG. 3.

FIG. 1 is a plan view schematically showing a memory cell array according to this embodiment. FIG. 2 is a view showing a ferroelectric memory device according to this embodiment. FIG. 3 is an enlarged plan view showing part of the memory cell array (portion indicated by symbol "A" in FIG. 1) shown in FIG. 1. FIG. 4 is a cross-sectional view along the line A—A shown in FIG. 3. In the plan views, numerals in parentheses indicate layers under the uppermost layers.

A ferroelectric memory device 1000 includes a memory cell array 100A in which memory cells 20 are arranged in a simple matrix, and various types of circuits for allowing information to be selectively written into or read from the memory cell 20, such as a first driver circuit 50 for selectively controlling first signal electrodes 12, a second driver circuit 52 for selectively controlling second signal electrodes 16, and a signal detecting circuit (not shown) such as a sense amplifier, as shown in FIG. 2.

In the memory cell array 100A, the first signal electrodes (word lines) 12 for selecting rows and the second signal electrodes (bit lines) 16 for selecting columns are arranged so as to intersect at right angles. Specifically, the first signal electrodes 12 are arranged at a specific pitch along the X direction. The second signal electrodes 16 are arranged at a specific pitch along the Y direction which intersect the X direction at right angles. The first signal electrodes may be the bit lines and the second signal electrodes may be the word lines, differing from this example.

In the memory cell array 100A, the first signal electrodes (lower electrodes) 12, ferroelectric layers 14 which make up ferroelectric capacitors, and the second signal electrodes (upper electrodes) 16 are layered on an insulating base 10, as shown in FIGS. 3 and 4. The first signal electrode 12, the ferroelectric layer 14, and the second signal electrode 16 make up a ferroelectric capacitor 20. Specifically, memory cells consisting of the ferroelectric capacitors 20 are formed in each intersection region between the first signal electrodes 12 and the second signal electrodes 16.

Dielectric layers 18 are formed between laminates consisting of the ferroelectric layer 14 and the second signal electrode 16 so as to cover exposed areas of the base 10 and the first signal electrodes 12. The dielectric layers 18 preferably have a dielectric constant lower than that of the ferroelectric layers 14. The parasitic capacitance or load capacitance of the second signal electrodes 16 can be decreased by allowing the dielectric layers 18 having a dielectric 93constant lower than that of the ferroelectric layers 14 to be interposed between the laminates consisting of the ferroelectric layer 14 and the second signal electrode 16. As a result, a read or write operation of the ferroelectric memory device 1000 can be performed at a higher speed.

In this embodiment, the ferroelectric layers 14 are formed linearly along the second signal electrodes 16. The parasitic capacitance or load capacitance of the first signal electrodes 12 can be decreased by forming the ferroelectric layers 14 linearly.

These linear ferroelectric layers 14 may be formed by patterning using a mask used to pattern the second signal electrodes 16 as described later.

A protective layer may optionally be formed of an insulating layer so as to cover the dielectric layers 18 and the second signal electrodes 16.

(Operations of Ferroelectric Memory Device)

An example of a read or write operation of the ferroelectric memory device 1000 is described below.

In the read operation, a read voltage "$V_0$" is applied to the capacitor in the selected cell. This also serves as a write operation of data "0". At this time, current flowing through the selected bit line or a potential when causing the bit line to be in a high impedance state is read by the sense amplifier. A specific voltage is applied to the capacitors in the non-selected cells in order to prevent occurrence of crosstalk during the read operation.

In the write operation, a voltage "$-V_0$" is applied to the capacitor in the selected cell in the case of writing data "1". In the case of writing data "0", a voltage which does not cause polarization inversion of the selected cell to occur is applied to the capacitor in the selected cell, thereby holding the "0" state written during the read operation. At this time, a specific voltage is applied to the capacitors in the non-selected cells in order to prevent occurrence of crosstalk during the write operation.

(Fabrication Method)

Figure 5:
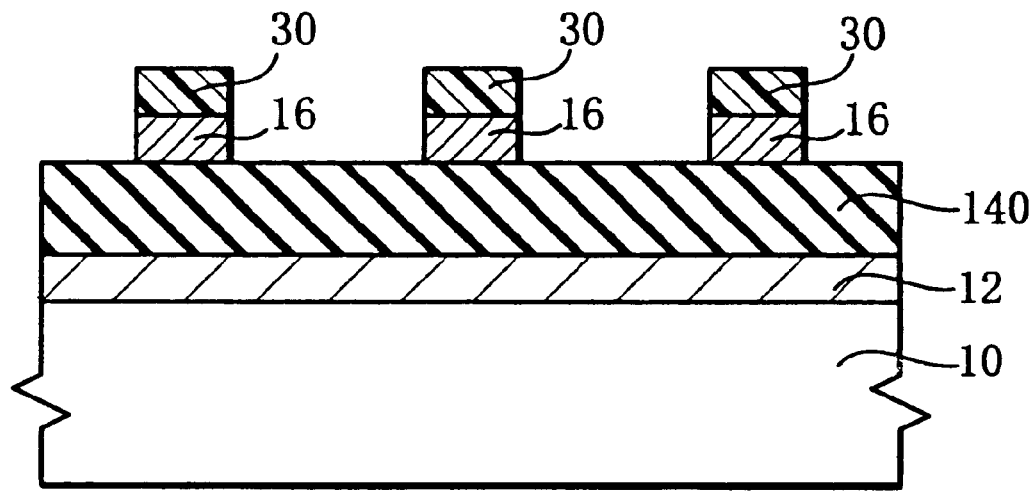
FIG. 5 is a cross-sectional view schematically showing a step of a method of fabricating a memory cell array according to the first embodiment of the present invention.
Figure 6:
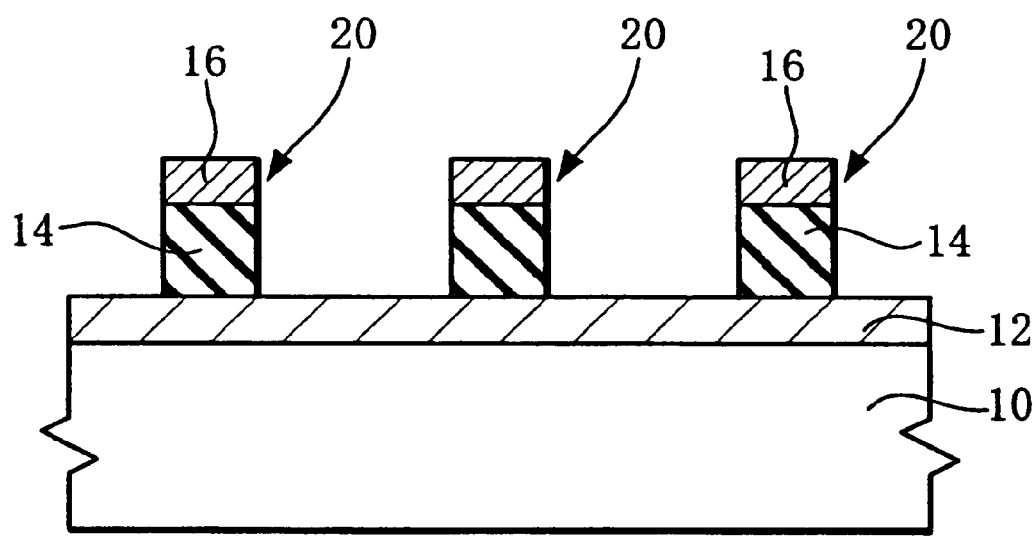
FIG. 6 is a cross-sectional view schematically showing a step of the method of fabricating a memory cell array according to the first embodiment of the present invention.

An example of a method of manufacturing the ferroelectric memory device 1000 is described below. FIGS. 5 and 6 are cross-sectional views schematically showing fabrication steps of the ferroelectric memory device 1000.

(1) First signal electrode

The first signal electrodes (lower electrodes) 12 arranged in a specific pattern are formed on the base 10, as shown in FIG. 5. The first signal electrodes 12 are formed by depositing an electrode material for forming the first signal electrodes 12 on the base 10 and patterning the deposited electrode material, for example.

There are no specific limitations to the electrode material insofar as the material has a function of making up part of the ferroelectric capacitors. In the case of using PZT as the material for forming the ferroelectric layers 14, platinum, iridium, compounds thereof, or the like may be used as the electrode material for the first signal electrodes 12. As the material for the first signal electrodes 12, Ir, $IrO_x$, Pt, $RuO_x$, $SrRuO_x$, and $LaSrCoO_x$ can be given. The first signal electrodes 12 may be either a single layer or a multilayer consisting of a plurality of layers.

As the deposition method of the electrode material, sputtering, vacuum deposition, CVD, or the like may be used. As the patterning method, lithographic technology may be used. As the method for selectively removing the deposited electrode material, an etching process such as RIE, sputter etching, or plasma etching may be used.

As the formation method of the electrode material, a method using undercoat layers, which is described in a second embodiment (see steps (1) and (2) in "Device fabrication method" in the second embodiment), may be used without patterning by etching.

(2) Deposition of ferroelectric layer

A continuous layer 140 consisting of a ferroelectric material (hereinafter called "ferroelectric layer 140") is formed on the entire surface of the base 10 on which the first signal electrodes 12 with a specific pattern are formed, as shown in FIG. 5. As the formation method of the ferroelectric layer 140, a spin coating process or a dipping process using a sol-gel material or an MOD (Metal Organic Decomposition) material, a sputtering process, an MOCVD (Metal Organic Chemical Vapor Deposition) process, and a laser ablation process can be given.

The composition of the material for the ferroelectric layer may be appropriately selected insofar as the material exhibits ferroelectricity and can be used as a capacitor insulating film. As examples of such ferroelectrics, PZT ($PbZr_zTi_{1-z}O_3$) and SBT ($SrBi_2Ta_2O_9$) can be given. Materials in which a metal such as niobium, nickel, or magnesium is added to these materials may also be applied. As specific examples of ferroelectrics, lead titanate ($PbTiO_3$), lead zirconate titanate ($Pb(Zr,Ti)O_3$), lead zirconate ($PbZrO_3$), lanthanum lead titanate (($Pb,La),TiO_3$), lanthanum lead zirconate titanate (($Pb,La)(Zr,Ti)O_3$), lead magnesium niobate zirconium titanate ($Pb(Zr,Ti)(Mg,Nb)O_3$), and the like may be used.

As the materials for these ferroelectrics, in the case of PZT, $Pb(C_2H_5)_4$, $(C_2H_5)_3PbOCH_2C(CH_3)_3$, or $Pb(C_{11}H_{19}O_2)_2$ for Pb, $Zr(n-OC_4H_9)_4$, $Zr(t-OC_4H_9)_4$, $Zr(C_{11}H_{19}O_2)_4$, or $Zr(C_{11}H_{19}O_2)_4$ for Zr, and $Ti(i-C_3H_7)_4$ for Ti may be used. In the case of STB, $Sr(C_{11}H_{10}O_2)_2$ for Sr, $Bi(C_6H_5)_3$ for Bi, and $Ta(OC_2H_5)_5$ for Ta may be used.

(3) Second signal electrode

The second signal electrodes (upper electrodes) 16 with a specific pattern are formed on the ferroelectric layer 140, as shown in FIG. 5. The second signal electrodes 16 are formed by depositing an electrode material for the second signal electrodes 16 on the ferroelectric layer 140 and patterning the deposited electrode material, for example. Specifically, resist layers 30 with a specific pattern are formed on the deposited electrode material layer. The electrode material layer is selectively etched using the resist layers 30 as masks, whereby the second signal electrodes 16 are formed.

The material, deposition method, and patterning method using lithography for the second signal electrodes 16 are the same as those of the formation steps of the first signal electrodes 12 described in the above (1). Therefore, further description is omitted.

(4) Patterning of ferroelectric layer

The ferroelectric layers 14 are patterned by selectively removing the ferroelectric layer 140 using the resist layers 30 as masks, as shown in FIGS. 5 and 6. As the method for selectively removing the deposited ferroelectric material, an etching process such as RIE, sputter etching, or plasma etching may be used. The resist layers 30 are removed by a conventional method such as dissolving or ashing.

(5) Dielectric layer

The dielectric layers 18 are formed between the laminates consisting of the ferroelectric layer 14 and the second signal electrode 16, as shown in FIG. 4. As the formation method of the dielectric layers 18, a vapor phase process such as CVD, in particular, MOCVD, or a liquid phase process such as a spin coating process or a dipping process may be used.

As the material for the dielectric layers 18, it is preferable to use a dielectric material having a dielectric constant lower than that of the ferroelectric layers 14 which make up the ferroelectric capacitors. In the case of using a PZT material for the ferroelectric layers, an inorganic material such as $SiO_2$, $Ta_2O_5$, $SrTiO_3$, or MgO, or an organic material such as a polyimide may be used as the material for the dielectric layers 18. In the case of using an SBT material for the ferroelectric layers 14, an inorganic material such as $SiO_2$, $Ta_2O_5$, $SrTiO_3$, $SrTa_2O_6$, or $SrSnO_3$, or an organic material such as a polyimide may be used as the material for the dielectric layers 18.

The memory cell array 100A is formed by these steps. According to this fabrication method, since the ferroelectric layers 14 which make up the ferroelectric capacitors 20 are continuously patterned using the resist layers 30 used to pattern the second signal electrodes 16 as masks, the number of fabrication steps can be decreased. Moreover, since the alignment tolerance for one mask becomes unnecessary in comparison with the case of patterning each layer using different masks, the memory cell array can be highly integrated.

Second Embodiment

Figure 7:
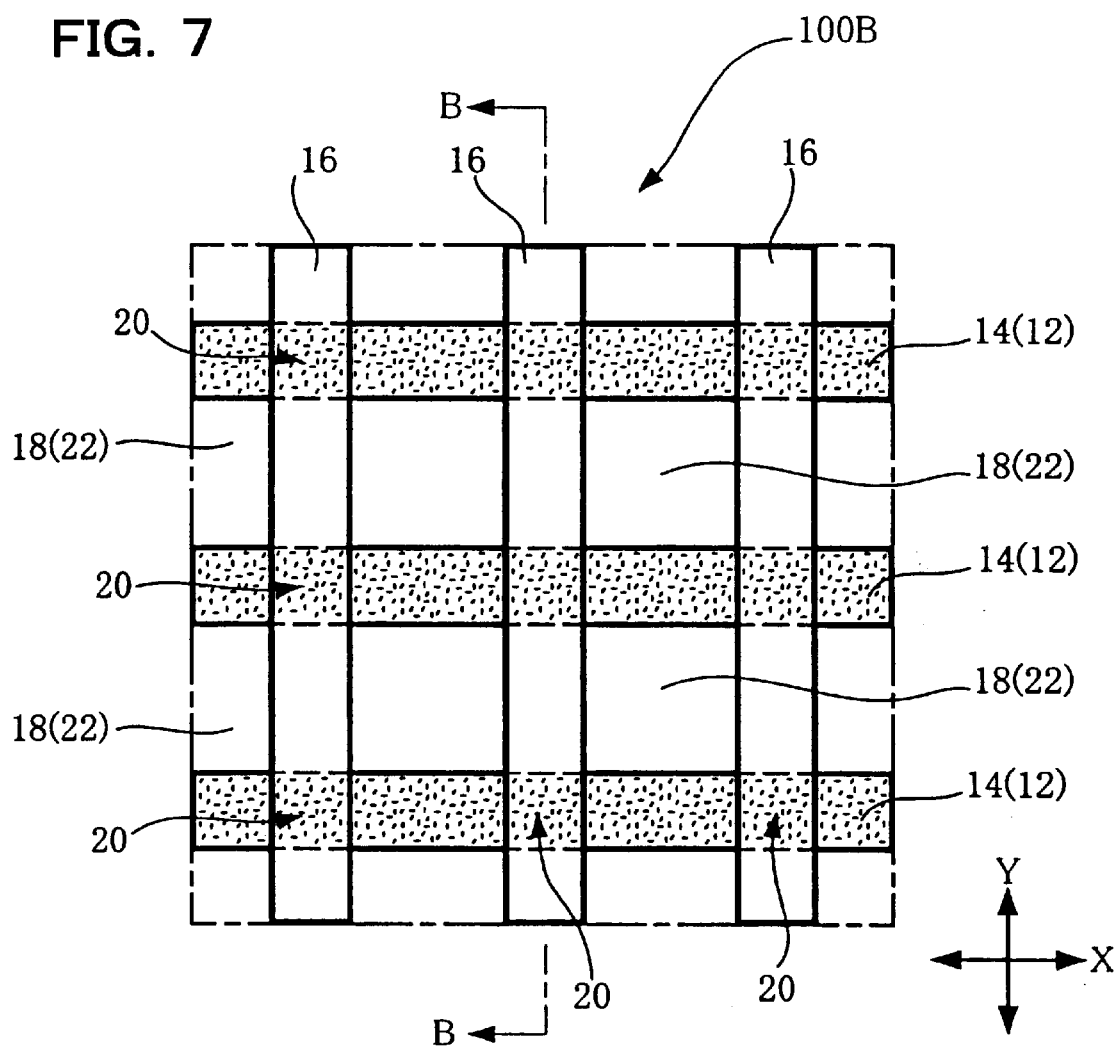
FIG. 7 is a plan view schematically showing a memory cell array according to a second embodiment of the present invention.
Figure 8:
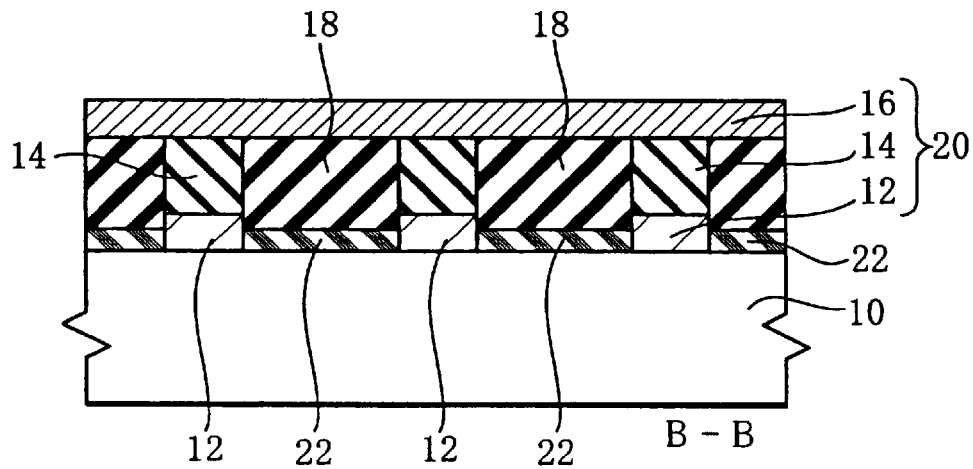
FIG. 8 is a cross-sectional view along the line B—B shown in FIG. 7.

FIG. 7 is a plan view schematically showing a portion of a memory cell array including ferroelectric capacitors according to this embodiment. FIG. 8 is a cross-sectional view along the line B—B shown in FIG. 7.

In this embodiment, components having substantially the same functions as those of the memory cell array of the first embodiment are denoted by the same reference numerals.

This embodiment differs from the first embodiment in that the ferroelectric layers which make up the ferroelectric capacitors are linearly layered on the first signal electrodes (lower electrodes).

In a memory cell array 100B, the first signal electrodes 12, the ferroelectric layers 14 which make up the ferroelectric capacitors, and the second signal electrodes 16 are layered on the insulating base 10. The first signal electrode 12, the ferroelectric layer 14, and the second signal electrode 16 make up the ferroelectric capacitor 20. Specifically, memory cells consisting of the ferroelectric capacitors 20 are formed in each intersection region between the first signal electrodes 12 and the second signal electrodes 16.

The first signal electrodes 12 and the second signal electrodes 16 are respectively arranged in the X direction and the Y direction at a specific pitch, as shown in FIG. 7.

The ferroelectric layers 14 are selectively formed on the first signal electrodes 12. Undercoat layers 22 are formed on the base 10 between the first signal electrodes 12. The dielectric layers 18 are formed on the undercoat layers 22. The dielectric layers 18 preferably have a dielectric constant lower than that of the ferroelectric layers 14. The parasitic capacitance or load capacitance of the second signal electrodes 16 can be decreased by allowing the dielectric layers 18 having a dielectric constant lower than that of the ferroelectric layers 14 to be interposed between laminates consisting of the first signal electrode 12 and the ferroelectric layer 14. As a result, a read or write operation of the ferroelectric memory device can be performed at a higher speed.

(Fabrication Method)

FIGS. 9 to 12 are cross-sectional views schematically showing manufacturing steps of the memory cell array 100B.

(1) Undercoat layer

A step of providing selectivity to the surface properties of the base 10 is performed. Providing selectivity to the surface properties of the base 10 means defining regions having different surface properties, such as wettability for materials to be deposited, on the surface of the base 10.

Figure 9:
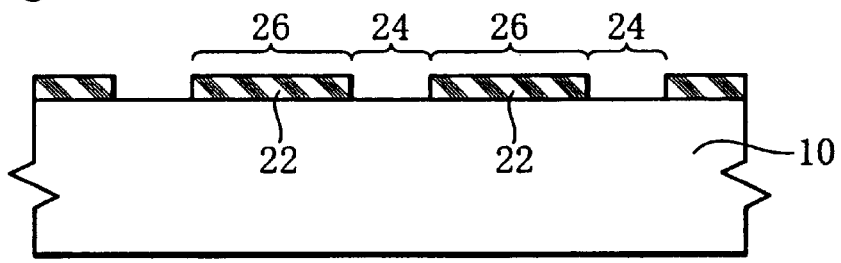
FIG. 9 is a cross-sectional view schematically showing a step of a method of fabricating a memory cell array according to the second embodiment of the present invention.

First regions 24 having an affinity for the materials forming components of the ferroelectric capacitors, particularly for the materials of the electrodes, and second regions 26 having a low affinity for the materials forming the components of the ferroelectric capacitors, particularly for the materials of the electrodes in comparison with the affinity of the first regions 24 are defined on the surface of the base 10, as shown in FIG. 9. The ferroelectric capacitors are selectively formed in the first regions 24 in the succeeding steps by utilizing selectivity between each region relating to the deposition rate of the materials or adhesion to the base caused by the difference in the surface properties.

Specifically, at least either the first signal electrodes 12 or ferroelectric layers 14 of the ferroelectric capacitors can be formed in the first regions 24 in the succeeding steps by a selective deposition process using a chemical vapor deposition (CVD) process, a physical vapor deposition process, or a liquid phase process, for example. In the case where the surface of the base 10 has properties which cause the materials for forming the components of the ferroelectric capacitors to be easily deposited, the surface of the base may be exposed in the first regions 24 and the undercoat layers 22 on which the above materials are deposited to only a small extent may be formed in the second regions 26, thereby providing selectivity relating to deposition of the materials for forming the components of the ferroelectric capacitors.

In this embodiment, the undercoat layer is formed over the entire surface of the base 10. The undercoat layer is removed in the first regions 24 while allowing the undercoat layers 22 to remain in the second regions 26, as shown in FIG. 9. Specifically, the following steps are performed.

The undercoat layers 22 may be formed using a vapor phase deposition process such as CVD or using a liquid phase process such as a spin coating process or a dipping process. In the latter case, liquid or a substance dissolved in a solvent is used. A silane coupling agent (organosilicon compound) or a thiol compound may be used as such a substance.

A thiol compound is a generic name for organic compounds containing a mercapto group (—SH) ($R^1$—SH; wherein $R^1$ represents a replaceable hydrocarbon group such as an alkyl group). Such a thiol compound is dissolved in an organic solvent such as dichloromethane or trichloromethane to prepare a solution at a concentration of about 0.1 to 10 mM, for example.

A silane coupling agent is a compound shown by $R^2{}_n SiX_{4-n}$ (wherein n is a natural number, $R^2$ represents a hydrogen atom or a replaceable hydrocarbon group such as an alkyl group), wherein X represents —$OR^3$, —COOH, —$OOCR^3$, —$NH_{3-n}R^3{}_n$, —OCN, halogen, or the like (wherein $R^3$ represents a replaceable hydrocarbon group such as an alkyl group). Of these silane coupling agents and thiol compounds, compounds containing a fluorine atom in which $R^1$ or $R^3$ is $C_n F_{2n+1} C_m H_{2m}$ (wherein n and m are natural numbers) are particularly preferable, because surface free energy of these compounds is increased and an affinity for other materials is lowered.

In addition, films obtained using a compound containing a mercapto group or —COOH group by the above method may also be used. Films formed of these materials may be used in the form of a monomolecular film or a built-up film thereof using an appropriate method.

In this embodiment, the undercoat layer is not formed in the first regions 24, as shown in FIG. 9. In the case of using a silane coupling agent for the undercoat layers 22, light irradiation may cause the molecular bonds to break at the interface with the base 10, whereby the undercoat layer may be removed. Mask exposure performed in lithography may be applied to patterning using light. The undercoat layers may be directly patterned using laser beams, electron beams, ion beams, or the like without using a mask.

The undercoat layers 22 may be selectively formed in the second regions 26 by transferring the undercoat layers 22 formed on another base. This enables deposition and patterning to be performed at the same time.

By causing the first regions 24 and the second regions 26 covered with the undercoat layers 22 to have different surface conditions, the difference in affinity for the materials forming the components of the ferroelectric capacitors in the succeeding steps can be produced, as shown in FIG. 9. In particular, if the undercoat layers 22 exhibit water repellency due to the possession of a fluorine molecule or the like, the material for forming the components of the ferroelectric capacitors can be selectively provided at the first regions 24 by providing the material in a liquid phase. Depending on the material for the undercoat layers 22, the material may be deposited in the first regions 24, on which the undercoat layers 22 are not present, using a vapor phase process due to an affinity for the materials forming the upper layer components. The components (first signal electrodes 12 and ferroelectric layers 14 in this embodiment) of the ferroelectric capacitors of the ferroelectric memory device can be formed in the succeeding steps by thus providing selectivity to the surface properties of the first regions 24 and the second regions 26.

(2) First signal electrode

Figure 10:
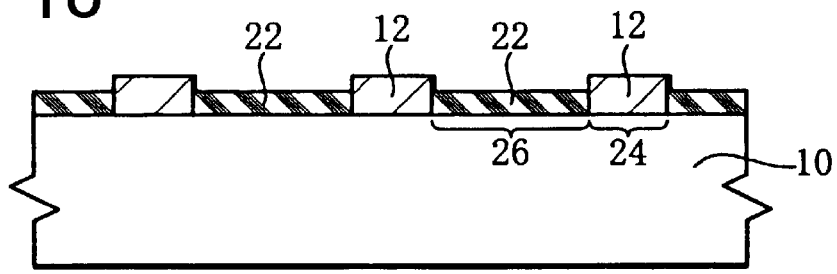
FIG. 10 is a cross-sectional view schematically showing a step of the method of fabricating a memory cell array according to the second embodiment of the present invention.

The first signal electrodes 12 which become the lower electrodes of the ferroelectric capacitors are formed corresponding to the first regions 24, as shown in FIG. 10. For example, a deposition step using a vapor phase process is performed for the entire surface of the base 10. This allows the selective deposition process to be performed. Specifically, the material is deposited in the first regions 24, but is deposited to only a small extent in the second regions 26, whereby the first signal electrodes 12 are formed only in the first regions 24. It is preferable to apply CVD, in particular, MOCVD as the vapor phase process. It is preferable that the material not be deposited in the second regions 26. However, it suffices that the deposition rate in the second regions 26 be two digits or more lower than that in the first regions 24.

The first signal electrodes 12 may be formed using a method of selectively supplying a solution of the material to the first regions 24 in a liquid phase, or using a mist deposition process in which a solution of the material is misted using ultrasonic waves or the like and selectively supplied to the first regions 24.

As the material for forming the first signal electrodes 12, platinum, iridium, or the like maybe used in the same manner as in the first embodiment. If the selectivity of surface properties is obtained by forming the first regions 24 and the undercoat layers 22 (second regions 26) containing the above material on the base 10, the material for forming the electrodes can be selectively deposited using $(C_5H_7O_2)_2Pt$, $(C_5HFO_2)_2Pt$, or $(C_3H_5)(C_5H_5)Pt$ for platinum or $(C_3H_5)_3Ir$ for iridium.

(3) Ferroelectric layer

Figure 11:
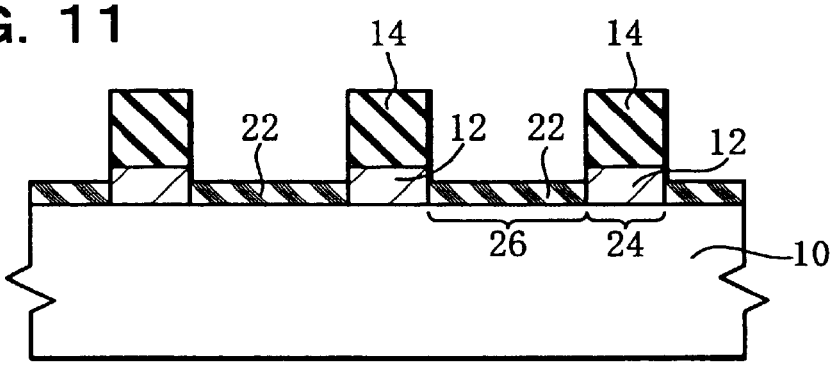
FIG. 11 is a cross-sectional view schematically showing a step of the method of fabricating a memory cell array according to the second embodiment of the present invention.

The ferroelectric layers 14 are formed on the first signal electrodes 12, as shown in FIG. 11. Specifically, a deposition step using a vapor phase process is performed for the entire surface of the base 10, for example. The material is deposited on the first signal electrodes 12, but is deposited to only a small extent in the second regions 26, whereby the ferroelectric layers 14 are formed only on the first signal electrodes 12. As the vapor phase process, CVD, in particular, MOCVD may be applied.

The ferroelectric layers 14 may be formed using a method of selectively supplying a solution of the material to the first signal electrodes 12 formed other than the second regions 26 in a liquid phase using an ink jet process or the like, or using a mist deposition process in which a solution of the material is misted using ultrasonic waves or the like and selectively supplied to the regions other than second regions 26.

The composition of the material for the ferroelectric layers 14 may be appropriately selected insofar as the material exhibits ferroelectricity and can be used as a capacitor insulating film. For example, SBT materials, PZT materials, materials to which niobium or a metal oxide such as nickel oxide or magnesium oxide is added, or the like may be used. As specific examples of ferroelectrics, the ferroelectrics described in the first embodiment can be given. As specific examples of the materials for ferroelectrics, the materials described in the first embodiment can be given.

(4) Dielectric layer

Figure 12:
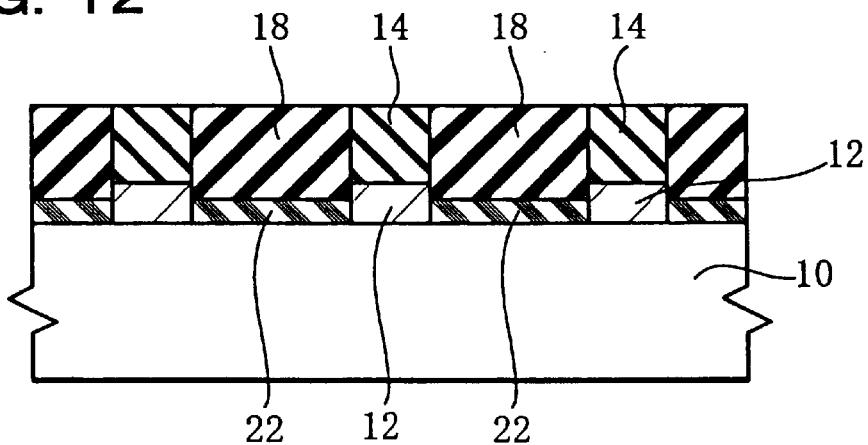
FIG. 12 is a cross-sectional view schematically showing a step of the method of fabricating a memory cell array according to the second embodiment of the present invention.

The dielectric layers 18 are formed in the second regions 26, specifically, in the regions between laminates consisting of the first signal electrode 12 and the ferroelectric layer 14 formed in the first regions 24, as shown in FIG. 12. As the formation method of the dielectric layers 18, a vapor phase process such as CVD, in particular, MOCVD, or a liquid phase process such as a spin coating process or a dipping process may be used. The dielectric layers 18 are preferably planarized so as to have a surface at the same level as the ferroelectric layers 14 using a CMP (Chemical Mechanical Polishing) process or the like. The second signal electrodes 16 can be easily formed with high accuracy by planarizing the dielectric layers 18 in this manner.

As the material for the dielectric layers 18, it is preferable to use a dielectric material having a dielectric constant lower than that of the ferroelectric layers 14 which make up the ferroelectric capacitors. In the case of using a PZT material for the ferroelectric layers, an inorganic material such as $SiO_2$, $Ta_2O_5$, $SrTiO_3$, or MgO, or an organic material such as a polyimide may be used as the material for the dielectric layers 18. In the case of using an SBT material for the ferroelectric layers 14, an inorganic material such as $SiO_2$, $Ta_2O_5$, $SrTiO_3$, $SrTa_2O_6$, or $SrSnO_3$, or an organic material such as a polyimide may be used as the material for the dielectric layers 18.

(5) Second signal electrode

The second signal electrodes (upper electrodes) 16 with a specific pattern are formed on the ferroelectric layers 14 and the dielectric layers 18, as shown in FIG. 8. The second signal electrodes 16 are formed by depositing an electrode material for the second signal electrodes 16 on the ferroelectric layers 14 and the dielectric layers 18 and patterning the deposited electrode material, for example.

There are no specific limitations to the electrode material insofar as the material has a function of making up part of the ferroelectric capacitors. In the case of using PZT as the material for forming the ferroelectric layers 14, platinum, iridium, compounds thereof, or the like may be used as the electrode material for the second signal electrodes 16, in the same manner as in the first embodiment. The second signal electrodes 16 may be either as a single layer or a multilayer consisting of a plurality of layers.

As the deposition method of the electrode material, sputtering, vacuum deposition, CVD, or the like may be used in the same manner as in the first embodiment. As the patterning method, lithographic technology may be used.

An insulating protective layer may optionally be formed on the entire surfaces of the ferroelectric layers 14, dielectric layers 18, and second signal electrodes 16. The memory cell array 100B can be formed in this manner.

According to the fabrication method of this embodiment of the present invention, at least one component which makes up the ferroelectric capacitor can be selectively formed in the first regions 24, but is formed to only a small extent in the second regions 26. Therefore, at least either the first signal electrodes (lower electrodes) or ferroelectric layers (first signal electrodes 12 and ferroelectric layers 14 in this embodiment) can be formed without etching. This method can prevent occurrence of a problem relating to readhering substances caused by by-products produced during etching such as in the case of patterning the first signal electrodes using sputter etching.

In the fabrication method of this embodiment, the undercoat layers 22 maybe removed in the second regions 26 after the step shown in FIG. 11. This step is performed after the deposition steps of the first signal electrodes 12 and the ferroelectric layers 14 have been completed. The undercoat layers 22 may be removed using the method described relating to the patterning step of the undercoat layers, for example. It is preferable to remove substances adhering to the undercoat layers 22 when removing the undercoat layers 22. For example, in the case where the material for the first signal electrodes 12 or the ferroelectric layers 14 adheres to the undercoat layers 22, such a material may be removed. The step of removing the undercoat layers 22 is not an indispensable condition for the present invention. The undercoat layers 22 may be allowed to remain.

In the case where the ferroelectric layers 14 are formed on the side of the first signal electrodes 12, it is preferable to remove these ferroelectric layers. In the removal step, dry etching may be applied, for example.

Figure 25:
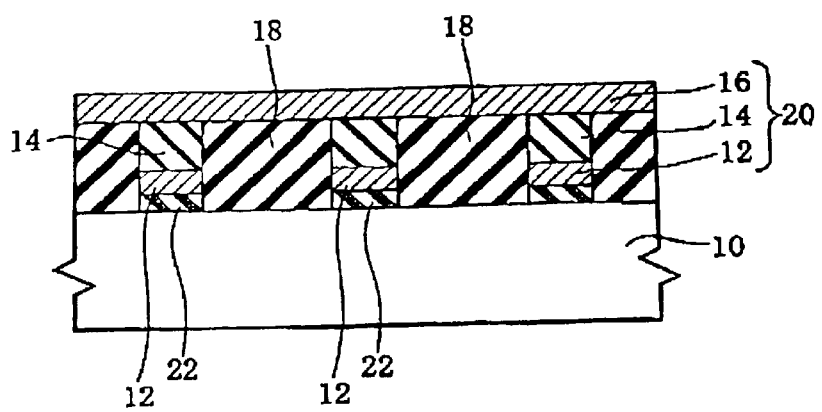
FIG. 25 is a cross-sectional view schematically showing a step of the method of A fabricating a memory cell array according to an exemplary embodiment of the invention.

In this embodiment, the undercoat layers 22 are formed in the second regions 26 so that the first regions 24 and the second regions 26 have surface properties differing in deposition capability of the material for forming at least one component (at least either the first signal electrode or ferroelectric layer) of the ferroelectric capacitors to be formed in the succeeding steps. As shown in FIG. 25, as a modification example, the undercoat layers 22 may be formed in the first regions 24. The ferroelectric capacitors may be selectively formed in the first regions 24 by preparing the material for forming at least one component of the ferroelectric capacitors so as to have a composition in a liquid phase or a vapor phase so that the material is deposited preferentially on the surface of the undercoat layers 22.

Thin undercoat layers may be selectively formed on the surface of the second regions 26. The material for forming at least one component of the ferroelectric capacitors may be supplied in a vapor phase or in a liquid phase over the entire surface of the base including the first regions 24 and the second regions 26, thereby forming the material layer for this component on the entire surface. The material layer for this component may be selectively removed by polishing or by a chemical technique only on the thin undercoat layers to selectively obtain the material layers for this component in the first regions 24.

In addition, a surface treatment may be selectively performed without forming layers on the surfaces of the first regions 24 and the second regions 26 so that the material for forming at least one component of the ferroelectric capacitors is deposited preferentially in the first regions 24.

Formation of the first signal electrodes (lower electrodes) and the ferroelectric layers using the undercoat layers, which is the feature of this embodiment of the present invention, is described in an International Patent Application based on the patent cooperation treaty applied for by the applicant of the present invention (application number: PCT/JP00/03590).

Third Embodiment

Figure 13:
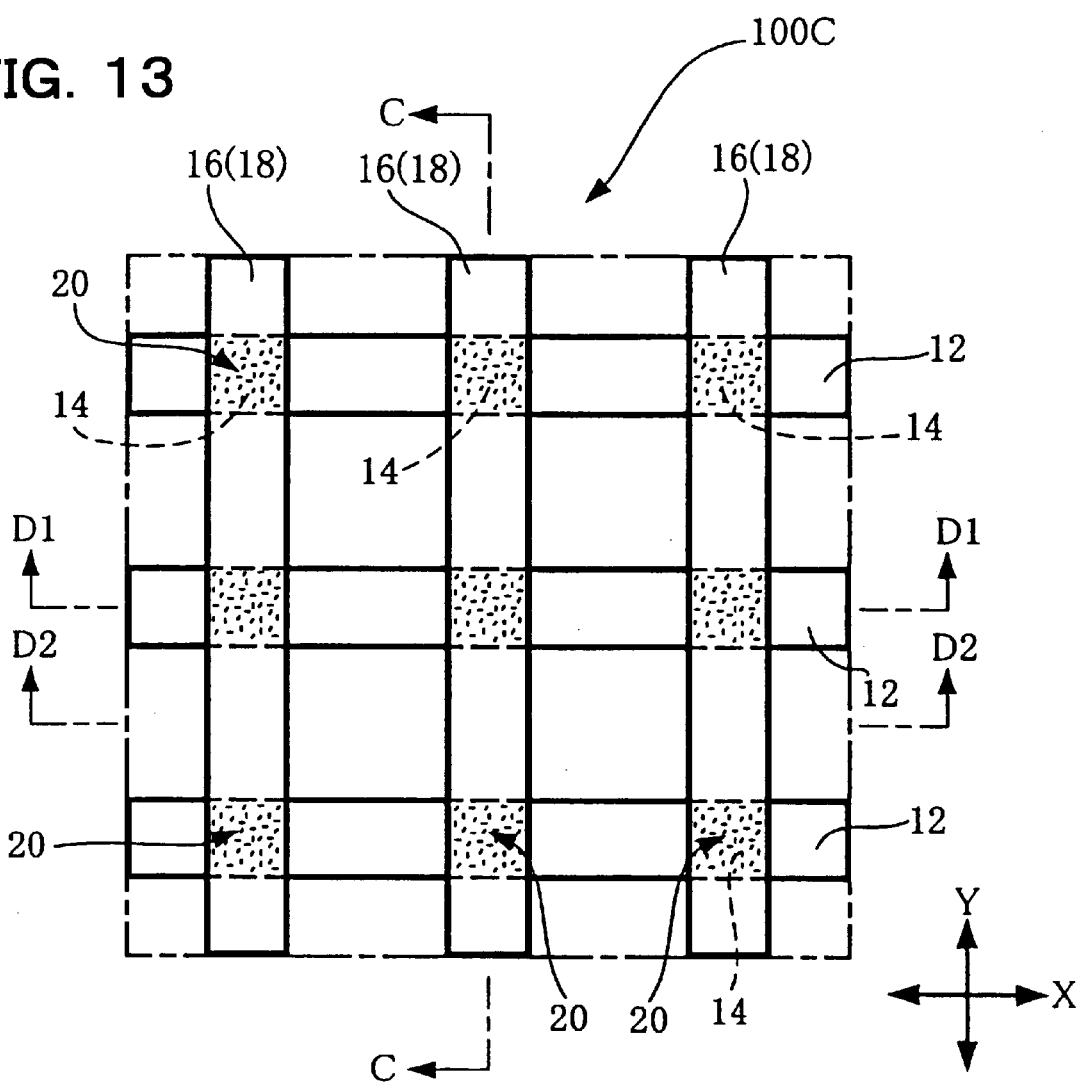
FIG. 13 is a plan view schematically showing a memory cell array according to a third embodiment of the present invention.
Figure 14:
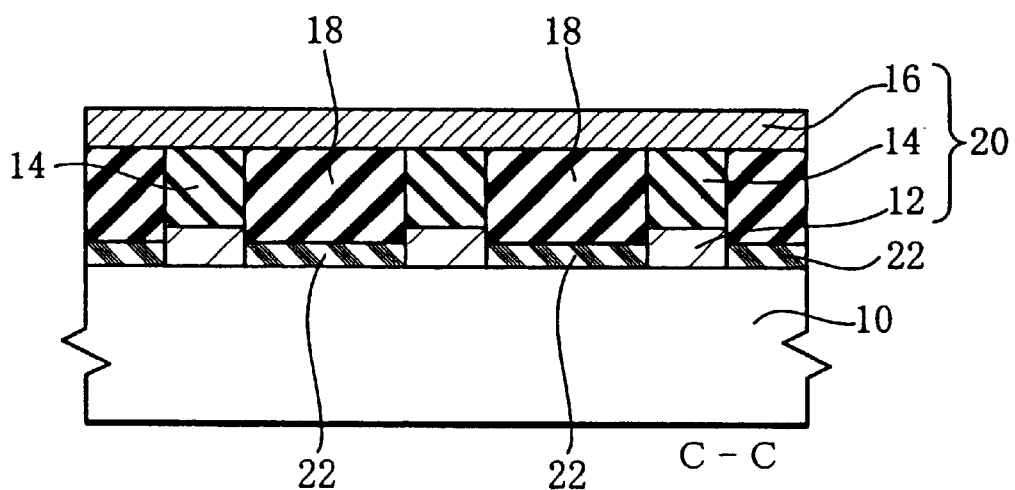
FIG. 14 is a cross-sectional view along the line C—C shown in FIG. 13.
Figure 15:
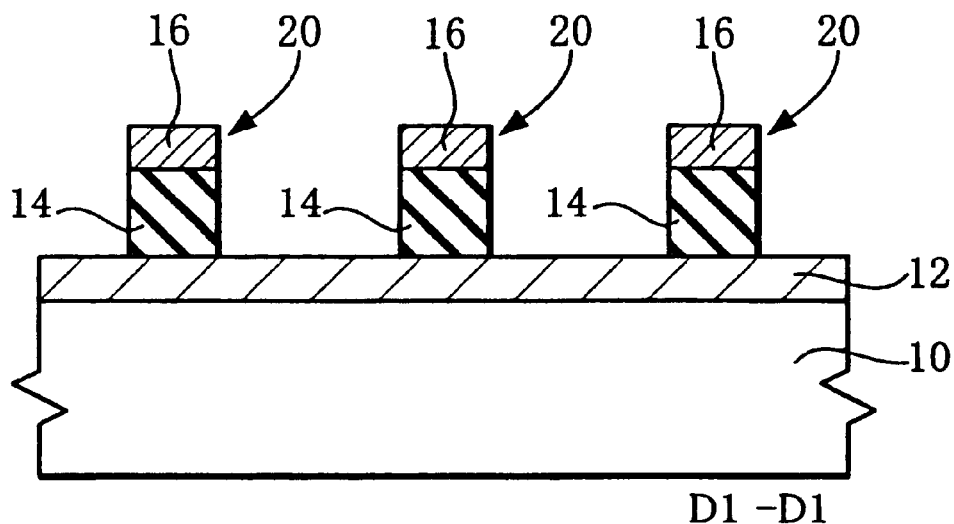
FIG. 15 is a cross-sectional view along the line D1—D1 shown in FIG. 13.
Figure 16:
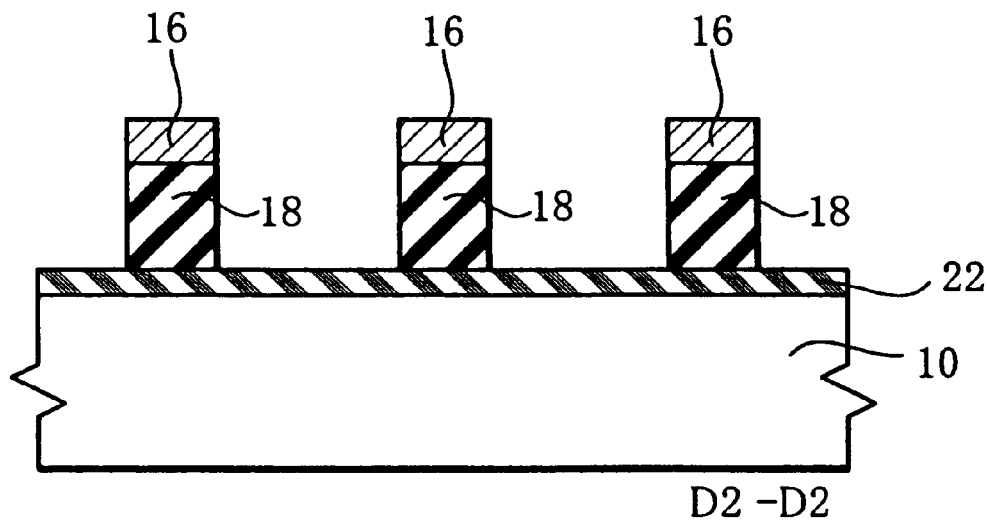
FIG. 16 is a cross-sectional view along the line D2—D2 shown in FIG. 13.

FIG. 13 is a plan view schematically showing a portion of a memory cell array including ferroelectric capacitors according to this embodiment of the present invention. FIG. 14 is a cross-sectional view along the line C—C shown in FIG. 13. FIG. 15 is a cross-sectional view along the line D1—D1 shown in FIG. 13. FIG. 16 is a cross-sectional view along the line D2—D2 shown in FIG. 13.

In this embodiment, sections having substantially the same functions as those of the memory cell array of the first embodiment are indicated by the same symbols.

This embodiment differs from the first and second embodiments in that the ferroelectric layers which make up the ferroelectric capacitors are formed only in the intersection regions between the first signal electrodes and the second signal electrodes.

In a memory cell array 100C, the first signal electrodes 12, the ferroelectric layers 14 which make up the ferroelectric capacitors, and the second signal electrodes 16 are layered on the insulating base 10. The first signal electrode 12, the ferroelectric layer 14, and the second signal electrode 16 make up the ferroelectric capacitor 20. Specifically, memory cells consisting of the ferroelectric capacitors 20 are formed in each intersection region between the first signal electrodes 12 and the second signal electrodes 16. The first signal electrodes 12 and the second signal electrodes 16 are respectively arranged in the X direction and the Y direction at a specific pitch, as shown in FIG. 13.

The ferroelectric layers 14 are selectively formed only in the intersection regions between the first signal electrodes 12 and the second signal electrodes 16. In a view along the second signal electrode 16 shown in FIG. 14, the ferroelectric layers 14 and the second signal electrodes 16 are layered on the first signal electrodes 12 on the base 10. The undercoat layers 22 are disposed between the first signal electrodes 12. The dielectric layers 18 are formed on the undercoat layers 22. In a view along the first signal electrode 12 shown in FIG. 15, the ferroelectric layers 14 and the second signal electrodes 16 are layered at a specific position of the first signal electrodes 12. No layer is present between laminates consisting of the ferroelectric layer 14 and the second signal electrode 16. In a view along the first signal electrode 12 shown in FIG. 15, the ferroelectric layers 14 and the second signal electrodes 16 are layered at a specific position of the first signal electrodes 12. In a view along the X direction shown in FIG. 16 in which the first signal electrodes 12 are not formed, the dielectric layers 18 and the second signal electrodes 16 are layered at a specific position of the undercoat layer 22. Dielectric layers may optionally be formed between laminates consisting of the ferroelectric layer 14 and the second signal electrode 16 and between laminates consisting of the dielectric layer 18 and the second signal electrode 16.

The dielectric layers 18 and the dielectric layers which are optionally formed preferably have a dielectric constant lower than that of the ferroelectric layers 14. The parasitic capacitance or load capacitance of the first signal electrodes 12 and the second signal electrodes 16 can be decreased by allowing the dielectric layers having a dielectric constant lower than that of the ferroelectric layers 14 to be interposed between the laminates consisting of the first signal electrode 12 and the ferroelectric layer 14 or between the laminates consisting of the ferroelectric layer 14 and the second signal electrode 16. As a result, a read or write operation of the ferroelectric memory device can be performed at a higher speed.

In this embodiment of the present invention, the ferroelectric layers 14 which make up the ferroelectric capacitors 20 are formed only in the intersection regions between the first signal electrodes 12 and the second signal electrodes 16. According to this configuration, the parasitic capacitance or load capacitance of both the first signal electrodes 12 and the second signal electrodes 16 can be decreased.

(Fabrication Method)

FIGS. 17 to 24 are cross-sectional views schematically showing manufacturing steps of the memory cell array 100C according to this embodiment of the present invention.

(1) Undercoat layer

A step of providing selectivity to the surface properties of the base 10 is performed. Providing selectivity to the surface properties of the base 10 means defining regions having different surface properties such as wettability for materials to be deposited on the surface of the base 10. Since the details are described in the second embodiment, only brief description is given below.

In this embodiment, the first regions 24 having an affinity for the materials forming the components of the ferroelectric capacitors, particularly for the materials of the electrodes, and the second regions 26 having a low affinity for the materials forming the components of the ferroelectric capacitors, particularly for the materials of the electrodes in comparison with the first regions 24 are defined on a surface of the base 10, as shown in FIG. 9. The ferroelectric capacitors are selectively formed in the first regions 24 in the succeeding steps by utilizing selectivity between each region relating to the deposition rate of the materials or adhesion to the base caused by the difference in the surface properties.

Specifically, in the case where the surface of the base 10 has properties which cause the materials for forming the components of the ferroelectric capacitors to be easily deposited, the surface of the base may be exposed in the first regions 24 and the undercoat layers 22 on which the above materials are deposited to only a small extent may be formed in the second regions 26, thereby providing selectivity relating to deposition of the materials for forming the components of the ferroelectric capacitors.

Figure 18:
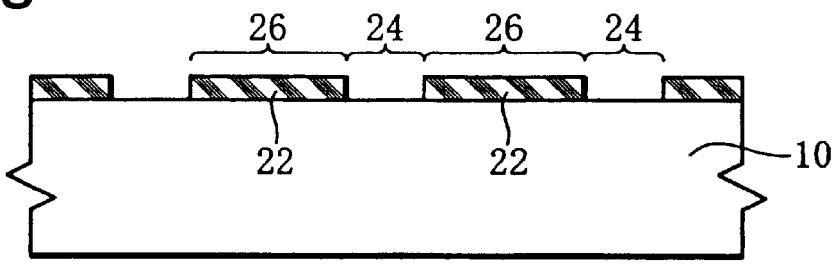
FIG. 18 is a cross-sectional view schematically showing a step of the method of fabricating a memory cell array according to the third embodiment of the present invention.

In this embodiment, the undercoat layer is formed over the entire surface of the base 10. The undercoat layer is removed in the first regions 24 while allowing the undercoat layers 22 to remain in the second regions 26, as shown in FIG. 18. As the formation method of the undercoat layers 22, the method described in the second embodiment may be employed.

(2) First signal electrode

Figure 19:
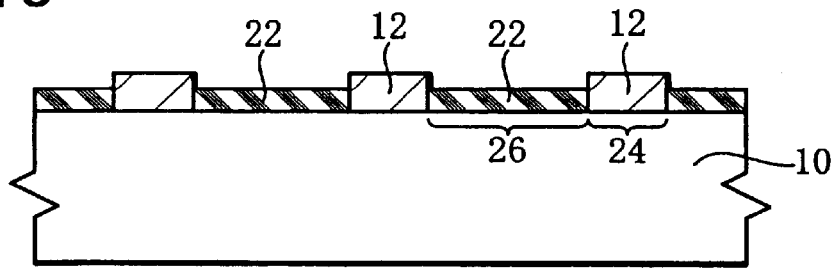
FIG. 19 is a cross-sectional view schematically showing a step of the method of fabricating a memory cell array according to the third embodiment of the present invention.

The first signal electrodes 12 which become the lower electrodes of the ferroelectric capacitors are formed corresponding to the first regions 24, as shown in FIG. 19. As the formation method and the electrode material for the first signal electrodes 12, the method and the material described in the second embodiment may be employed.

(3) Ferroelectric layer

Figure 20:
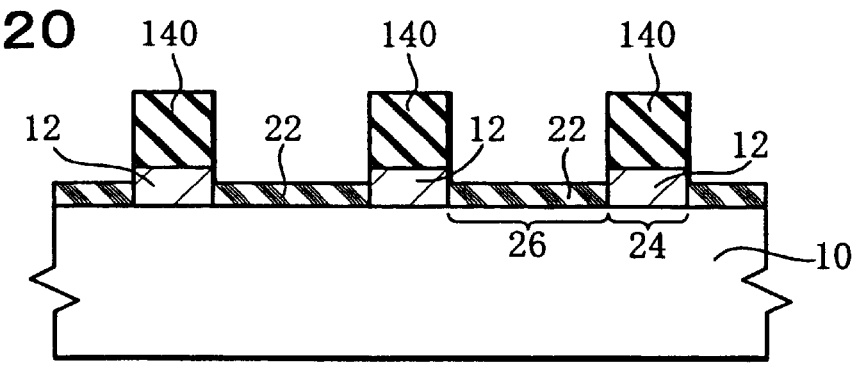
FIG. 20 is a cross-sectional view schematically showing a step of the method of fabricating a memory cell array according to the third embodiment of the present invention.

Ferroelectric layers 140 are formed on the first signal electrodes 12 as shown in FIG. 20. Specifically, a deposition step using a vapor phase process is performed for the entire surface of the base 10. This causes the material to be deposited on the first signal electrodes 12, but to be deposited to only a small extent in the second regions 26, whereby the ferroelectric layers 140 are formed only on the first signal electrodes 12. As the deposition method of the ferroelectric layers 140, the method described in the second embodiment may be employed.

The composition of the material for the ferroelectric layers 14 may be appropriately selected insofar as the material exhibits ferroelectricity and can be used as a capacitor insulating film. For example, SBT materials, PZT materials, materials to which a metal such as niobium, nickel, or magnesium is added, or the like may be used. As specific examples of ferroelectrics, the ferroelectrics described in the first embodiment can be given. As specific examples of the materials for ferroelectrics, the materials described in the first embodiment can be given.

(4) Dielectric layer

Figure 17:
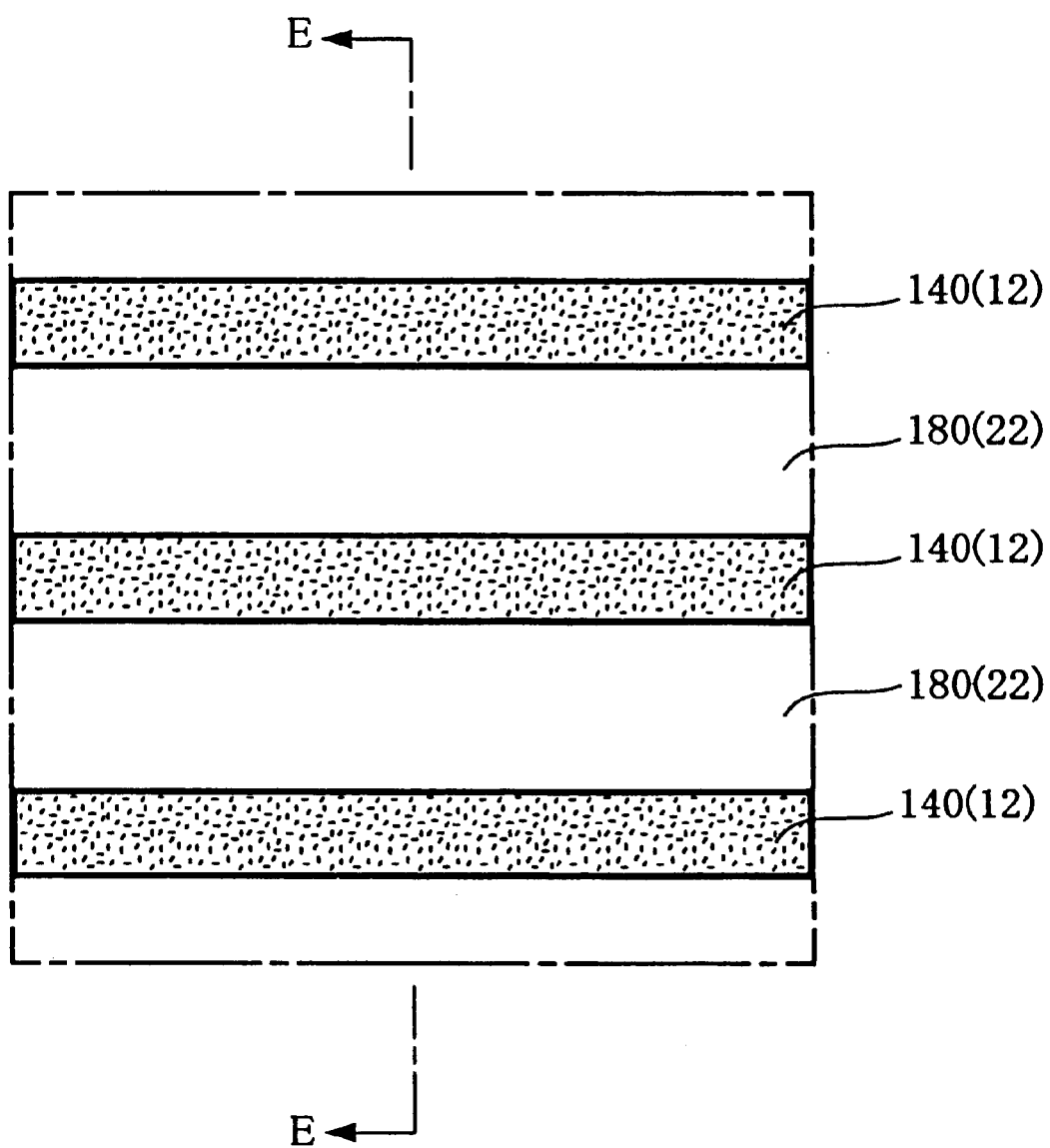
FIG. 17 is a plan view schematically showing a step of a method of fabricating a memory cell array according to the third embodiment of the present invention.
Figure 21:
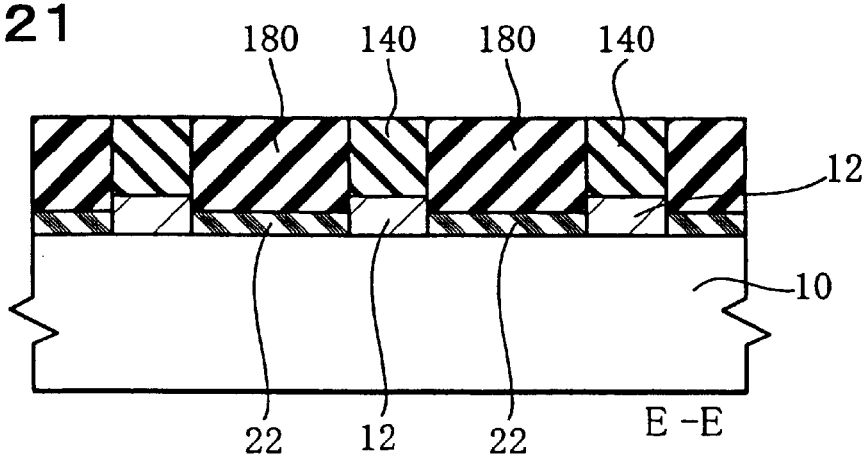
FIG. 21 is a cross-sectional view along the line E—E shown in FIG. 17, which schematically shows a step of the method of fabricating a memory cell array according to the third embodiment of the present invention.

Dielectric layers 180 are formed in the second regions 26, specifically, in the regions between the laminates consisting of the first signal electrode 12 and the ferroelectric layer 14 formed in the first regions 24, as shown in FIGS. 17 and 21. FIG. 21 is a cross-sectional view along the line E—E shown in FIG. 17.

As the formation method of the dielectric layers 180, the method described in the first embodiment may be employed. The dielectric layers 180 are preferably planarized using a CMP process or the like so as to have a surface at the same level as the ferroelectric layers 140. The second signal electrodes 16 can be easily formed with high accuracy by planarizing the dielectric layers 180 in this manner.

As the material for the dielectric layers 180, it is preferable to use a dielectric material having a dielectric constant lower than that of the ferroelectric layers 14 which make up the ferroelectric capacitors. In the case of using a PZT material for the ferroelectric layers, an inorganic material such as $SiO_2$, $Ta_2O_5$, $SrTiO_3$, or $MgO$, or an organic material such as a polyimide may be used as the material for the dielectric layers 180. In the case of using an SBT material for the ferroelectric layers 14, an inorganic material such as $SiO_2$, $Ta_2O_5$, $SrTiO_3$, $SrTa_2O_6$, or $SrSnO_3$, or an organic material such as a polyimide may be used as the material for the dielectric layers 180.

The first signal electrodes 12 and the ferroelectric layers 140 are layered in the first regions 24, and the undercoat layers 22 and the dielectric layers 180 are layered in the second regions 26 by the steps (1) to (4).

(5) Second signal electrode

Figure 22:
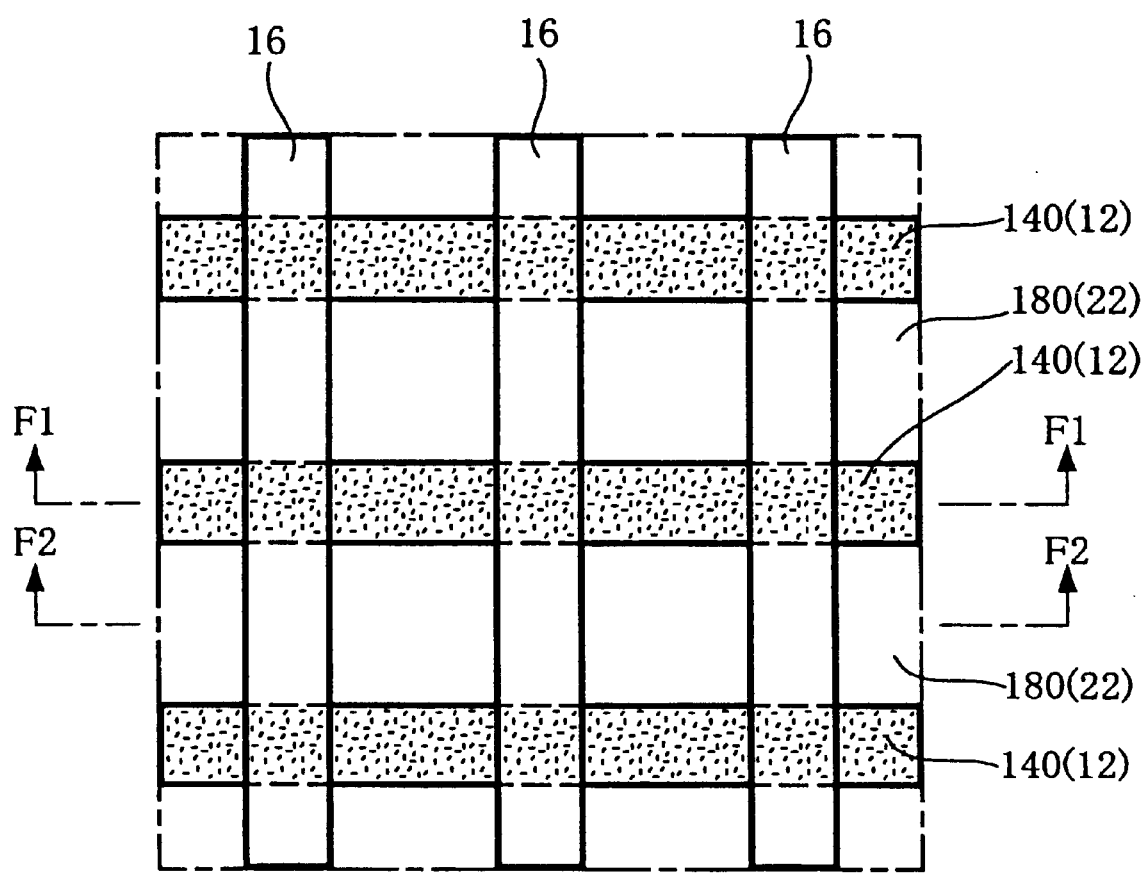
FIG. 22 is a plan view schematically showing a step of the method of fabricating a memory cell array according to the third embodiment of the present invention.
Figure 23:
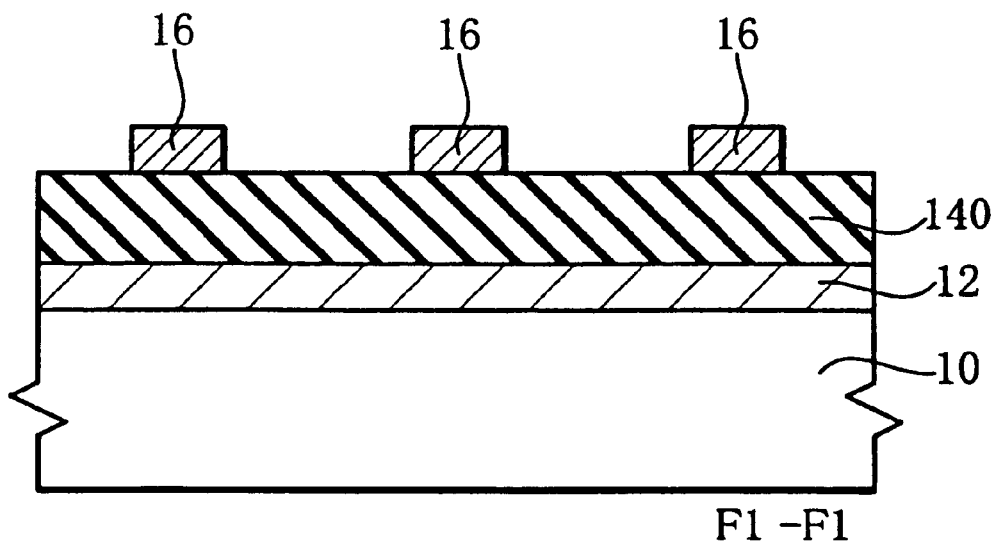
FIG. 23 is a cross-sectional view along the line F1—F1 shown in FIG. 22, which schematically shows a step of the method of fabricating a memory cell array according to the third embodiment of the present invention.
Figure 24:
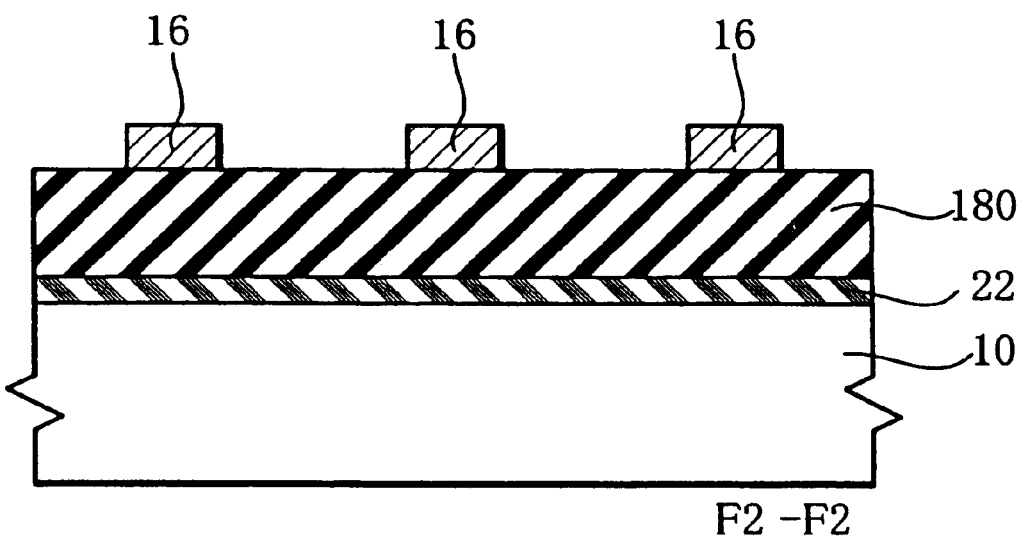
FIG. 24 is a cross-sectional view along the line F2—F2 shown in FIG. 22, which schematically shows a step of the method of fabricating a memory cell array according to the third embodiment of the present invention.

The second signal electrodes (upper electrodes) 16 with a specific pattern are formed on the ferroelectric layers 140 and the dielectric layers 180, as shown in FIGS. 22 to 24. The second signal electrodes 16 are formed by depositing an electrode material for forming the second signal electrodes 16 on the ferroelectric layers 140 and the dielectric layers 180 and patterning the deposited electrode material, for example.

There are no specific limitations to the electrode material insofar as the material has a function of making up part of the ferroelectric capacitors. As the material for forming the ferroelectric layers 140, the material described in the first embodiment may be employed. As the deposition method of the electrode material, sputtering, vacuum deposition, CVD, or the like may be used in the same manner as in the first embodiment. As the patterning method, lithographic technology may be used.

For example, the second signal electrodes 16 may be patterned by forming resist layers (not shown) on the electrode material layer for the second signal electrodes 16 and etching the electrode material layer using the resist layers as masks, in the same manner as in the first embodiment.

(6) Patterning of ferroelectric layer

The ferroelectric layers 14 are patterned by selectively removing the ferroelectric layers 140 using the resist layers (not shown) as masks, as shown in FIGS. 15 and 16. As the method for selectively removing the deposited ferroelectric material, an etching process such as RIE, sputter etching, or plasma etching may be used in the same manner as in the first embodiment. The resist layers are removed by a conventional method such as dissolving or ashing.

(7) Further dielectric layer

If necessary, further dielectric layers (not shown) may be formed between the laminates consisting of the ferroelectric layer 14 and the second signal electrode 16 and between the laminates consisting of the undercoat layer 22 and the second signal electrode 16. As the formation method of the dielectric layers, the formation method of the dielectric layers 180 in the step (4) may be used.

The memory cell array 100C is formed by these steps. This fabrication method has the same advantages as in the first embodiment and the second embodiment. Specifically, at least either the first signal electrodes (lower electrodes) or ferroelectric layers (first signal electrodes 12 and ferroelectric layers 14 of this embodiment) can be formed without etching. Therefore, occurrence of a problem relating to readhering substances caused by by-products produced during etching such as in the case of patterning the first signal electrodes using sputter etching can be prevented. Moreover, since the ferroelectric layers 14 are patterned continuously using the resist layers used to pattern the second signal electrodes 16 as masks, the number of fabrication steps can be decreased. Furthermore, since the alignment tolerance for one mask becomes unnecessary in comparison with the case of patterning each layer using different masks, the memory cell array can be highly integrated.

The above examples illustrate cases in which the dielectric layers 18 or 180 are formed in the regions in which the ferroelectric capacitors are not present. However, the present invention can be applied to configurations in which the dielectric layers 18 or 180 are not provided.

What is claimed is:

1. A memory cell array having ferroelectric capacitors, wherein:

memory cells formed of ferroelectric capacitors are arranged in a matrix;

each of the ferroelectric capacitors includes a first signal electrode, a second signal electrode disposed in a direction intersecting the first signal electrode, and a ferroelectric layer disposed at least in an intersection area of the first and second signal electrodes;

a dielectric layer that is provided between laminates each of which includes the first signal electrode and the ferroelectric layer, the dielectric layer being formed of a material having a dielectric constant lower than a dielectric constant of the ferroelectric layer; and the ferroelectric layer is disposed linearly along one of the first signal electrode and the second signal electrode.

2. The memory cell array having ferroelectric capacitors as defined in claim 1, wherein the ferroelectric layer is selectively disposed over the first signal electrode.

3. The memory cell array having ferroelectric capacitors as defined in claim 2, wherein:

the dielectric layer covers part of the base.

4. The memory cell array having ferroelectric capacitors as defined in claim 3, wherein an undercoat layer having surface properties differing from surface properties of the base is formed on the base.

5. The memory cell array having ferroelectric capacitors as defined in claim 4, wherein:

the undercoat layer is provided in an area in which the ferroelectric capacitors are not formed; and a surface of the undercoat layer has a low affinity for a material forming the ferroelectric capacitors, in comparison with a surface of the base.

6. The memory cell array having ferroelectric capacitors as defined in claim 4, wherein:

the undercoat layer is provided in an area in which the ferroelectric capacitors are formed; and a surface of the undercoat layer has a high affinity for a material forming the ferroelectric capacitors, in comparison with a surface of the base.

7. The memory cell array having ferroelectric capacitors as defined in claim 1, wherein the ferroelectric layer is selectively disposed under the second signal electrode.

8. The memory cell array having ferroelectric capacitors as defined in claim 7, wherein:

the dielectric layer covers part of the base and part of the first signal electrode.

9. A ferroelectric memory device comprising the memory cell array as defined in claim 1.

10. A memory cell array having ferroelectric capacitors, wherein:

memory cells formed of ferroelectric capacitors are arranged in a matrix;

each of the ferroelectric capacitors includes a first signal electrode, a second signal electrode disposed in a direction intersecting the first signal electrode, and a ferroelectric layer disposed at least in an intersection area of the first and second signal electrodes;

a dielectric layer that is provided between laminates each of which includes the first signal electrode and the ferroelectric layer, the dielectric layer being formed of a material having a dielectric constant lower than a dielectric constant of the ferroelectric layer; and the ferroelectric layer is disposed only in the intersection area of the first and second signal electrodes.

11. The memory cell array having ferroelectric capacitors as defined in claim 10, wherein:

the dielectric layer covers part of the base.

12. The memory cell array having ferroelectric capacitors as defined in claim 11, wherein the dielectric layer covers the exposed surface of the base and an exposed surface of the first signal electrode.

13. The memory cell array having ferroelectric capacitors as defined in claim 11, wherein an undercoat layer having surface properties differing from surface properties of the base is formed on the base.

14. The memory cell array having ferroelectric capacitors as defined in claim 13, wherein:

the undercoat layer is provided in an area in which the ferroelectric capacitors are not formed; and a surface of the undercoat layer has a low affinity for a material forming the ferroelectric capacitors, in comparison with a surface of the base.

15. The memory cell array having ferroelectric capacitors as defined in claim 13, wherein:

the undercoat layer is provided in an area in which the ferroelectric capacitors are formed; and a surface of the undercoat layer has a high affinity for a material forming the ferroelectric capacitors, in comparison with a surface of the base.

* * * * *